United States Patent [19]

Nagai et al.

[11] Patent Number: 4,694,234
[45] Date of Patent: Sep. 15, 1987

[54] APPARATUS FOR COMPENSATING A QUANTIZATION ERROR

[75] Inventors: Yasuo Nagai, Tokyo; Fumiyoshi Abe, Kanagawa, both of Japan

[73] Assignee: Sony Corporation, Tokyo, Japan

[21] Appl. No.: 807,740

[22] Filed: Dec. 11, 1985

[30] Foreign Application Priority Data

Dec. 25, 1984 [JP] Japan ................................ 59-279428

[51] Int. Cl.⁴ .............................................. G05B 19/29
[52] U.S. Cl. .................................... 318/603; 318/327; 318/608; 318/312
[58] Field of Search ............... 318/603, 326, 327, 607, 318/608, 341, 312, 329, 615, 616, 606, 618, 314

[56] References Cited

U.S. PATENT DOCUMENTS

| 3,736,485 | 5/1973 | Scarrott | 318/603 |
|---|---|---|---|
| 3,836,833 | 9/1974 | Harris | 318/603 |
| 3,969,663 | 7/1976 | Arthur | 318/603 |
| 4,006,394 | 2/1977 | Cuda | 318/603 |
| 4,066,941 | 1/1978 | Foster | 318/603 |
| 4,266,171 | 5/1985 | Mashimo | 318/603 |
| 4,278,924 | 7/1981 | Mawatari | 318/603 |
| 4,315,200 | 2/1982 | Yamada | 318/603 |
| 4,503,374 | 3/1985 | Sakano | 318/603 |
| 4,506,202 | 3/1985 | Tajima | 318/603 |
| 4,529,922 | 7/1985 | Ono | 318/603 |

Primary Examiner—William M. Shoop, Jr.
Assistant Examiner—Patrick C. Keane
Attorney, Agent, or Firm—Lewis H. Eslinger; Alvin Sinderbrand

[57] ABSTRACT

An apparatus for compensating for a quantization error has a time detector circuit for detecting a time signal on the basis of the number of clock signals occurring within the period of such time signal, a quantization error detector circuit for generating a quantization error time signal corresponding to a time difference between the time signal and the clock signal and being in the form of an analog voltage value, and a compensator circuit for compensating a digital detected time derived from the time detector circuit on the basis of an analog quantization error time from the quantization error detector circuit.

11 Claims, 15 Drawing Figures

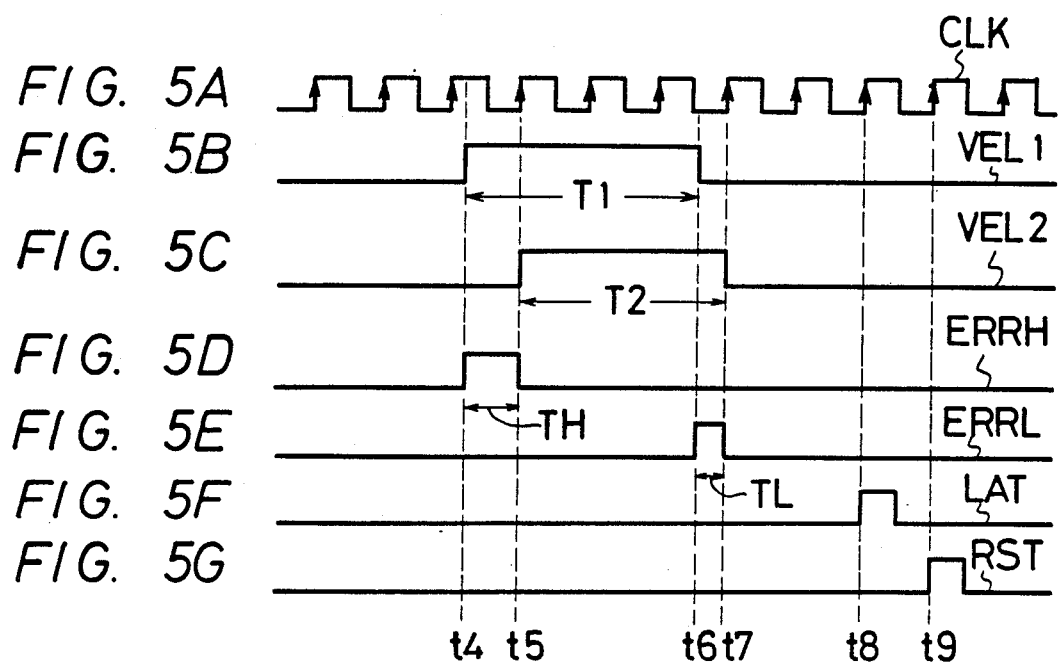
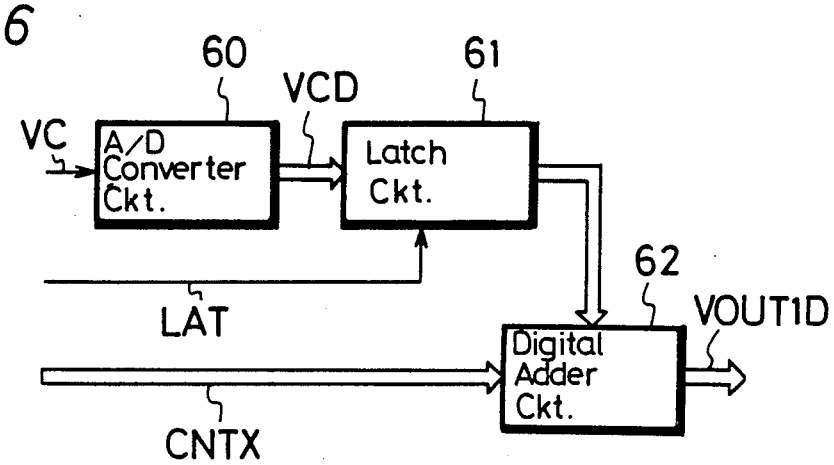

APPARATUS FOR COMPENSATING A QUANTIZATION ERROR

BACKGROUND OF THE INVENTION

1. Field of the Invention

This invention relates generally to an apparatus for compensating a quantization error and more particularly is directed to such an apparatus for use with a servo system of a video tape recorder (VTR).

2. Description of the Prior Art

In the prior art, a time information detecting apparatus which detects time information, such as, a pulse width of a pulse signal, is employed in various kinds of apparatus which include a servo system for a motor of a video tape recorder (VTR).

In the VTR, as shown in FIG. 1, in order to rotate a DC motor 1, such as a drum motor, a capstan motor or the like at a constant rotational speed, the rotational speed of the motor 1 is detected by a frequency generator 2 and a control voltage signal corresponding to the detected rotational speed (time information) is generated by a time information detecting apparatus 3 and is supplied through a motor drive amplififying circuit 4 to the motor 1.

As the time information detecting apparatus 3 used in such speed servo system, it is known to employ one constructed as shown in FIG. 2.

Referring to FIG. 2, a time signal VEL (FIG. 3A) consisting of a pulse signal from the frequency generator 2 (FIG. 1) is supplied to a delay circuit 5 and to a sampling pulse generator circuit 8. The delay circuit 5 generates a timing delay signal DLY (FIG. 3B), which rises to a logic level "H" during a predetermined time T0 measured from every other rising-up time point t1 of the time signal VEL, and supplies the signal DLY to a slope generator circuit 6. The slope generator circuit 6 supplies to a sample and hold circuit 7 a voltage signal V which gradually and rectilinearly increases in voltage value from a time point t2 at which the timing delay signal DLY falls to a logic "L" as shown in FIG. 3C.

A sampling pulse generator circuit 8 receives the time signal VEL, detects a rising edge time t3 of the time signal VEL delayed by one period TX from the time t1 at which the timing delay signal DLY rises to the logic "H", produces a sampling pulse signal SMP shown in FIG. 3D and supplies the sampling pulse signal SMP to the sample and hold circuit 7.

The sample and hold circuit 7 is adapted to sample and to hold the value of the voltage signal V when the sampling pulse signal SMP is applied thereto and generates the value thereof as a control voltage signal VCON (FIG. 3C).

Consequently, with the time information detecting apparatus 3 of FIG. 2, when the motor 1 is rotated at a speed higher than a predetermined rotational speed, the period TX of the time signal VEL is shortened and hence the sampling pulse signal SMP is delivered at an earlier time, so that the sample and hold circuit 7 produces the control voltage signal VCON with a lower level. On the other hand, when the motor 1 is rotated at a rotational speed lower than the predetermined rotational speed, the period TX of the time signal VEL is increased so that the sample and hold circuit 7 produces the control voltage signal VCON with a higher level.

Therefore, the motor 1 is controlled so as to be rotated at a constant rotational speed.

However, if such time information detecting apparatus 3 is formed as an analogue circuit arrangement, it will be defective in that the output voltage signal VCON will fluctuate due to changes of ambient temperature, the fluctuation of a power supply source speed control and so on, and hence the voltage is unstable.

For this reason, it has been considered to form this time information detecting apparatus 3 as a digital circuit arrangement. In such digital time information detecting apparatus, since the time information of the analogue amount is digitized, a quantization error occurs so that the accuracy of the output signal is restricted by this quantization error. Accordingly, in order to effect stable control, for example, of a motor, a high clock frequency must be selected.

For example, if the period of the pulse signal VEL from the frequency generator 2 is 50 $\mu$s and a drum motor is to be stably controlled at an accuracy of within 0.02%, it is necessary to detect each period at more than 5000 counts. This requires a clock frequency expressed by the following Eq. (1)

$$1/50 \; (\mu s) \times 5000 = 100 \; (MHz) \tag{1}$$

However, since the maximum operation frequency of a widely used digital IC lies in a range from about 10 to 20 MHz, if the clock frequency of 100 MHz is intended to be realized, there is the fear that a digital IC, will not be practically available for that purpose. Further, even if the clock frequency of 100 MHz may be realized, the apparatus becomes complicated in construction and large in size because many interface circuits are required by each circuit and also such apparatus comsumes a large amount of power. Therefore, the described apparatus is not suitable in practice.

OBJECTS AND SUMMARY OF THE INVENTION

Accordingly, it is an object of this invention to provide an apparatus for compensating for a quantization error which can stably operate regardless of the change of temperature, the fluctuation of a power source voltage and so on.

It is another object of this invention to provide an apparatus for compensating for a quantization error, and which has a simple circuit arrangement and can produce a detected value of high resolution.

It is a further object of this invention to provide an apparatus for compensating for a quantization error which is suitable for use with a servo system of a video tape recorder.

According to one aspect of the present invention, there is provided an apparatus for compensating a quantization error which comprises a time detector circuit for detecting a time signal on the basis of the number of clock signals occurring within the period of the time signal, a quantization error detector circuit for producing quantization error time signal corresponding to a time difference between the time signal and the clock signal and being in the form of an analogue voltage value, and a compensator circuit for compensating a digital detected time derived from the time detector circuit on the basis of an analogue quantization error time from the quantization error detector circuit.

Since a time indicated by the time signal is detected by the time detector circuit using the clock signal, the circuit arrangement can be formed as a digital circuit arrangement so that the detected result is given stability against any change of temperature and fluctuation of a power source voltage.

Moreover, the quantization time errors that occur when the time detector circuit is formed as a digital circuit arrangement, are detected as an analogue voltage by means of an analogue circuit arrangement and on the basis of the detected voltage, the detected time signal is compensated for by the compensator circuit.

As a result, the quantization time errors, which will inevitably occur because of the digital circuit arrangement, can be removed from the detected time signal so that it is possible to obtain a detected output of high accuracy.

These and other objects, features and advantages of the present invention will become apparent from the following detailed description of the preferred embodiments taken in conjunction with the accompanying drawings, throughout which like reference numerals designate like elements and parts.

BRIEF DESCRIPTION OF THE DRAWINGS

FIGS. 5A to 5G are timing charts useful for explaining the operation of the apparatus shown in FIG. 4; and FIG. 6 is a block diagram showing another embodiment of the present invention.

DESCRIPTION OF THE PREFERRED EMBODIMENTS

The invention will now be described in detail with reference to this invention.

Figure 1:
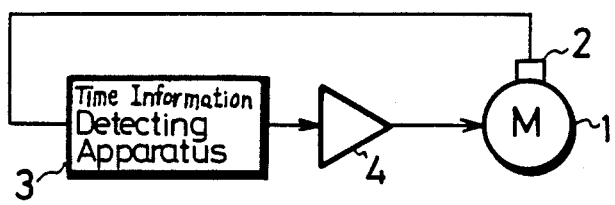
FIG. 1 is a block diagram showing a prior art time information detecting apparatus applied to a motor speed control.
Figure 2:
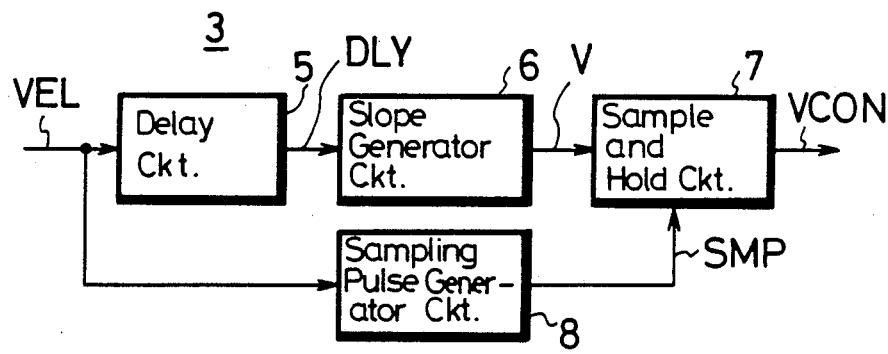
FIG. 2 is a block diagram showing in greater detail the prior art time information detecting apparatus of FIG. 1.
Figure 3A:
FIGS. 3A to 3D are timing charts useful for explaining the operation of the apparatus of FIG. 2.
Figure 3B:
Figure 3C:
Figure 3D:
Figure 4:
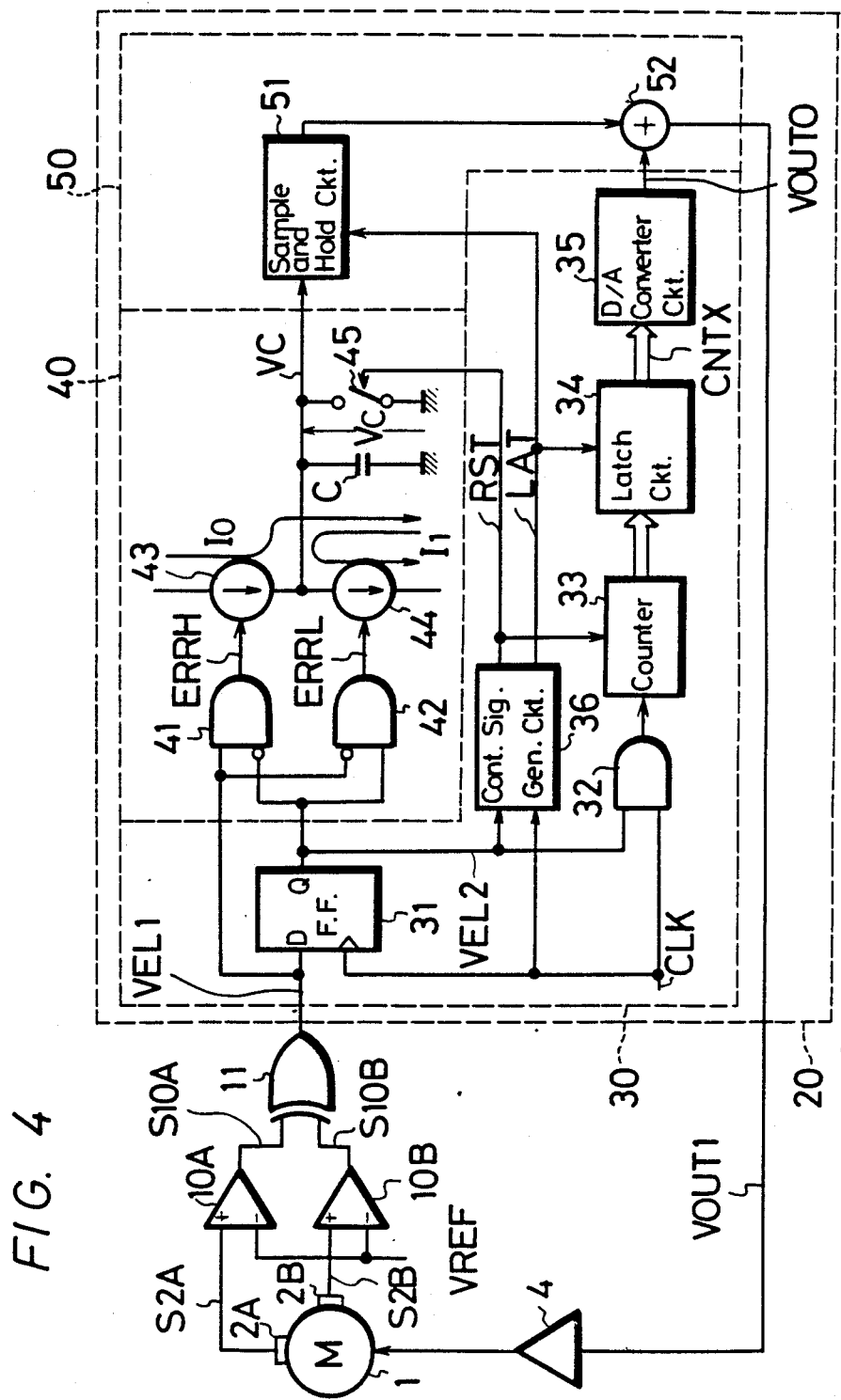
FIG. 4 is a block diagram showing an embodiment of an apparatus for compensating for a quantization error according to the present invention.

Referring to FIG. 4, in which two frequency generators 2A and 2B are mounted on a drum motor 1 of a VTR such that the phases of output signals S2A and S2B from the frequency generators 2A and 2B differ from each other by 90°. The output signals S2A and S2B from the frequency generators 2A and 2B are supplied to comparator circuits 10A and 10B, respectively.

The comparator circuits 10A and 10B compare the output signals S2A, S2B with a reference voltage VREF and reshape them into pulse signals S10A and S10B, respectively. The reshaped pulse signals S10A and S10B are fed to an exclusive-OR circuit 11. The exclusive-OR circuit 11 supplies an exclusive-OR signal of the pulse signals S10A and S10B to a time information detecting apparatus 20 as an original time signal VEL1 which is to be detected (FIG. 5B).

In the time information detecting apparatus 20, a D-type flip-flop circuit 31 in a time detector circuit 30 is supplied at its data input terminal D with the original time signal VEL1 and at its clock input terminal with a clock signal CLK having a frequency of 7 MHz (FIG. 5A). This flip-flop circuit 31 is triggered at the leading edge of the clock signal CLK, generating a synchronized time signal VEL2 (FIG. 5C), which is provided by synchronizing the original time signal VEL1 with the clock signal CLK, as a Q output. This signal VEL2 is fed as a gating signal to one input terminal of a 2-input AND circuit 32.

Since the AND circuit 32 is supplied at the other input terminal with the clock signal CLK, the AND circuit 32 allows the clock signal CLK to pass therethrough during a period T2 in which the synchronized time signal VEL2 rises to the logic level "H". The clock signal CLK passing through and circuit 22 is fed to a counter 33.

The counter 33 is adapted to carry out the count operation each time the clock signal CLK is supplied thereto and a latch circuit 34 latches the counted value of the counter 33 when the latch circuit 34 is supplied with a latch signal LAT (FIG. 5F) and delivers the counted value CNTX to a D/A (digital-to-analogue) converter circuit 35.

The D/A converter circuit 35 converts the latched output CNTX from the latch circuit 34 to an analogue signal and delivers the same as an output signal VOUT0 from time detector circuit 30. This signal VOUT0 is supplied through an adder circuit 52 and the motor drive amplififying circuit 4 to the motor 1 as the speed control signal.

A reset signal RST (FIG. 5G) for resetting the counter 33 and the latch signal LAT for specifying the latch timing of the latch circuit 34 are both generated by a control signal generator circuit 36. The control signal generator circuit 36 receives the synchronized time signal VEL2 and the clock signal CLK, detects the trailing edge of the synchronized time signal VEL2 and supplies to the latch circuit 34 the latch signal LAT (FIG. 5F) which rises up at a time t8 synchronized with the clock signal CLK and occurring a predetermined number of clock pulses after a falling down time t7 of the synchronized time signal VEL2.

Accordingly, the counted value CNTX of the counter 33 at the time t8 at which the latch signal LAT is fed to the latch circuit 34 becomes the value or number of clock pulses counted during the rising period T2 of the synchronized time signal VEL2. When the motor 1 is rotated at a rotational speed higher than the predetermined rotational speed, the rising period T2 is of reduced duration so that the counted value CNTX which is latched is small and hence the speed control signal VOUT0 of a relatively low level is fed back to the motor 1. When on the other hand the motor 1 is rotated at a rotational speed lower than the predetermined rotational speed, the rising period T2 becomes longer so that the counted value CNTX is large and hence the speed control signal VOUT0 of a high level is fed back to the motor 1.

The control signal generator circuit 36 generates the reset signal RST (FIG. 5G) which rises up in synchronism with the clock signal CLK at a time t9 delayed from the time t8 at which the latch signal LAT is produced. Accordingly, the counter 33 is reset only after the latch operation is carried out by the latch circuit 34. The output time t9 of the reset signal RST is selected to precede the next time at which the synchronized time signal VEL2 again rises.

If the original time signal VEL1 is used as the gating signal for controlling the AND circuit 32 and allowing the clock signal CLK to pass during the rising-up period of signal VEL1 and to be fed to the counter 33, the original number of clock signals CLK passed during the time period T1 may increase or decrease without a corresponding change in motor speed. However, if the synchronized time signal VEL2, which is provided by synchronizing the original time signal VEL1 with the clock signal CLK, is used as the gating signal as shown in FIG. 4, it is possible to prevent the original number of the clock signals CLK passing during the rising-up time period T1 of the original time signal VEL1 from being increased or decreased independently of motor speed.

By the way, the rising-up time period T1 of the original time signal VEL1 is an analogue amount which continuously varies with the change of the rotational speed of the motor 1. On the other hand, the rising-up time period T2 of the synchronized time signal VEL2 is a multiple of the period of the clock signal CLK, and hence changes stepwise. Consequently, as shown in FIGS. 5D and 5E, quantization error time periods TH and TL occur in the rising-up and falling-down portions of the original time signal VEL1. The apparatus for compensating for a quantization error is shown in FIG. 4 include, in addition to the above mentioned circuit arrangement, a quantization error detector circuit 40 for detecting the quantization error time periods and a compensator circuit 50 for compensating for such errors.

In the quantization error detector circuit 40, 2-input AND circuits 41 and 42 are adapted to detect the error time period TH at the rising edge portion and the error time period TL at the falling-down portion of the original time signal VEL1, respectively.

The AND circuit 41 is supplied at its one input terminal with the original time signal VEL1 (FIG. 5B) and at its other input terminal with an inverted version $\overline{VEL2}$ of the synchronized time signal VEL2 (FIG. 5C). Accordingly, the AND circuit 41 produces a leading edge error time signal ERRH (FIG. 5D) which is delivered to a first constant current circuit 43. On the other hand, the AND circuit 42 is supplied at its one input terminal with an inverted version $\overline{VEL1}$ of the original time signal VEL1 and at its other input terminal with the synchronized time signal VEL2. Thus the AND circuit 42 produces a trailing edge error time signal ERRL (FIG. 5E) which is delivered to a second constant current circuit 44.

The first constant current circuit 43 is adapted to supply a constant current I0 to a capacitor C and to charge it during the leading edge error time period TH in which the leading edge error time signal ERRH rises up to the logic "H". The second constant current circuit 44 is adapted to permit the flow therethrough of a constant current I1 so as to discharge the capacitor C during the trailing edge error time period TL in which the trailing edge error time signal ERRL rises up to the logic "H". Accordingly, after the charging and discharging operations of the capacitor C have been completed, a voltage $V_C$ across the capacitor has a value corresponding to a time difference (TH−TL) between the leading error time period TH and the trailing error time period TL. Since the time difference (TH−TL) is equal to the time difference (T1−T2) between the rising-up period T1 of the original time signal VEL1 and the rising-up period T2 of the synchronized time signal VEL2, a voltage having a value corresponding to a total quantization error time period (T1−T2) remains on the capacitor C. This residual voltage $V_C$ is supplied to the compensator circuit 50 as an error time period detecting voltage signal.

The capacity of the capacitor C and the constant currents I1 and I0 flowing through the capacitor C are selected such that the residual voltage of the capacitor C per unit time may become equal to a voltage of the speed control signal VOUT0 generated by the D/A converter circuit 35 per unit time.

In the compensator circuit 50, a sample and hold circuit 51 is adapted to sample and hold the error time period detecting voltage signal $V_C$ from the capacitor C and to deliver the same thus held to another input of adder circuit 52 when circuit 51 is supplied with the latch signal LAT (FIG. 5F) from the control signal generator circuit 36.

Accordingly, the adder circuit 52 compensates for the quantization error by adding the control voltage signal VOUT0 corresponding to the rising-up time period T2 of the synchronized time signal VEL2 with the voltage signal VC corresponding to the quantization error time period (T1−T2). Thus, the adder circuit 52 produces the control voltage signal VOUT1 corresponding to the rising-up time period T1 of the original time signal VEL1.

Further in FIG. 4, a switching circuit 45 is connected in parallel to the capacitor C. When this switching circuit 45 is supplied with the reset signal RST (FIG. 5G) from the control signal generator circuit 36, it is closed during a predetermined time period corresponding to the duration of the reset signal or pulse RST. Due to the closing operation of the switching circuit 45, the capacitor C completely discharges the accumulated charges and is placed in the standby mode for the charge and discharge operation of the next period of the original time signal VEL1.

According to the circuit arrangement of FIG. 4, when the motor 1 is rotated and hence the original time signal VEL1 is supplied to the time information detecting apparatus 20, the original time signal VEL1 is synchronized with the clock signal CLK by the D-type flip-flop circuit 31 to provide the synchronized time signal VEL2 and then the rising-up time period T2 of the synchronized time signal VEL2 is counted by the counter 33. The counted value is latched by the latch circuit 34 at the time t8 and is then converted by the D/A converter circuit 35 to the analogue voltage signal VOUT0, which is then fed to the adder circuit 52.

When the original time signal VEL1 is fed to the time information detecting apparatus 20, in the quantization error detecting apparatus 40, the rising error time signal ERRH is supplied from the AND circuit 41 to the constant current source circuit 43 during the error time period TH from the time t4, driving the constant current circuit 43 so as to charge the capacitor C. Then, during the error time period TL from the time t6, the trailing edge error time signal ERRL is supplied from the AND circuit 42 to the constant current circuit 44, for driving the constant current circuit 44 so as to discharge the capacitor C. Therafter, at the time t8, the voltage $V_C$ across the capacitor C is sampled and then held by the sample and hold circuit 51, which is then delivered to the adder circuit 52.

Accordingly, from the time t8, the adder circuit 52 produces the speed control signal VOUT1 the quantization error component of which is compensated for by adding the voltage signal VC to the speed control signal VOUT0. This speed control signal VOUT1 is fed back through the amplifying circuit 4 to the motor 1, by which the motor 1 is controlled.

Thereafter, at the time t9, the reset signal RST is fed to the counter 33 and the switching circuit 45, thereby clearing the counted value of the counter 33 and restoring the value of the voltage across the capacitor C to the reference value (for example, 0 V), and thus setting the time information detecting apparatus 20 in a standby mode for the next period of the original time signal VEL1.

As described above, with the apparatus of FIG. 4, the quantization time period error (TH−TL)=(T1−T2) is detected in the form of an analogue amount, that is, as the voltage $V_C$ across the capacitor C, and the time signal VOUT0 measured in a digital fashion and then converted to an analogue value is compensated for by this detected amount, so that it is possible to obtain a measuring time which is accurate enough for the measuring time of the origianl time signal VEL1. If accuracy sufficient for practical use is merely obtained by a digital circuit arrangement, it is necessary to select the frequency of the clock signal CLK to be, for example, 100 MHz, and that can not be practically realized. However, since the apparatus for compensating for a quantization error in accordance with the present invention includes the quantization error detector circuit 40 and the compensator circuit 50, in order to achieve the same accuracy, it is sufficient to select the frequency of the clock signal CLK to be, for example, about 7 MHz. Thus, the circuit arrangement according to this invention can be made practical and simple in construction.

According to the circuit arrangement of FIG. 4, since the time signal detected with high accuracy is used as the speed control signal of the motor 1, it is possible to increase the accuracy of the rotational speed of the motor 1.

While in the above described embodiment of the invention, the time information detecting apparatus 20 is applied to the speed control apparatus for the motor 1, the present invention is not limited to that application, but can be widely applied to any apparatus in which the time of a time signal is measured and then delivered as an electrical signal. For example, this invention can be applied to a control apparatus in which a phase difference between two signals is measured as a time signal and the control operation is carried out so as to remove such phase difference. Also, the present invention can be applied to a case in which a time signal to be measured is one with a total amount of more than two rising periods.

Further, while in the above described embodiment the time signal, which is measured by a digital circuit arrangement and is compensated for by an analogue circuit arrangement, is delivered in the form of an analogue amount from the output stage, the present invention is not limited to such arrangement but can be applied to a case in which the resulting signal is delivered in the form of a digital amount from the output stage. For example, when a detected time signal is supplied to a display apparatus so as to display the measured time thereon, it is practical to generate the time signal in the form of a digital amount.

When the measured time signal is delivered in the form of a digital amount, instead of the circuit arrangement formed of the D/A converter circuit 35, the analogue adder circuit 52 and the sample and hold circuit 51 shown in FIG. 4, there can be used a circuit arrangement according to another embodiment of the present invention, and of which a main part is shown on FIG. 6. In the apparatus of FIG. 6, the voltage $V_C$ across the capacitor C (FIG. 4) is converted to a digital signal VCD by an A/D converter circuit 60. The digital signal VCD is latched by a latch circuit 61 at the timing of the leading edge of the latch circuit LAT and the latched digital signal is added to the latch output CNTX from the latch circuit 34 (FIG. 4) in a digital adder circuit 62 and thereby the measured time is delivered as a digital signal VOUT1D.

According to the present invention as set forth above, since the time signal can be measured by means formed of the digital circuit arrangement and the quantization error caused upon the measurement can be detected and compensated for by means formed of the analogue circuit arrangement, the apparatus of the invention can be stably operated regardless of the change of temperature and the fluctuation of the power supply voltage. In this case, although a digital circuit arrangement is employed for measuring the time signal, it is possible to obtain a practical apparatus for compensating for a quantization error and which can produce the detected value of high resolution. Consequently, although the frequency of the clock signal used for the digitalization is selected to be within the operation frequency of the ordinary digital IC, it is possible to obtain the satisfactory accuracy.

Although preferred embodiments of the invention have been described in detail above, it will be apparent that many modifications and variations could be effected therein by one skilled in the art within departing from the spirit or scope of the invention as defined by the appended claims only.

We claim as our invention:

1. An apparatus for detecting a pulse width of a pulse signal comprising:
   means for generating reference clock pulses;
   means for counting a number of said reference clock pulses occurring during said pulse signal and providing a count value indicating a pulse width of said pulse signal;
   means for detecting a phase difference between said reference clock pulses and said pulse signal and including analogue means for generating an analogue signal corresponding to said phase difference; and
   means for compensating said count value in response to said analogue signal to thereby generate pulse width data having a reduced quantization error.

2. The apparatus according to claim 1, in which said phase difference detecting and analogue signal generating means includes a first detector for detecting a phase difference between said clock pulse and a rising edge portion of said pulse signal, a second detector for detecting a phase difference between said clock pulse and a trailing edge portion of said pulse signal, and an analogue converting circuit for converting a signal coresponding to a difference between phase differences derived from said first and second detectors to said analogue signal.

3. The apparatus according to claim 2, in which said converting circuit includes a capacitor and charge and discharge circuits for charging and discharging said capacitor in response to said output signals of said first and second detectors, respectively.

4. The apparatus according to claim 3, in which said counting means includes a counter, a latch circuit connected to said counter and a digital-to-analogue converter connected to said latch circuit.

5. The apparatus according to claim 4, in which said compensating means includes an adder circuit for adding said analogue signal to an output signal of said digital-to-analogue converter.

6. A servo circuit for controlling a motor comprising:
   means for generating a pulse signal indicating speed of said motor;

means for generating reference clock pulses;

means for counting the number of said reference clock pulses occurring during said pulse signal and producing a count value indicating a pulse width of said pulse signal;

means for detecting a phase difference between said reference clock pulses and said pulse signal and including analogue means for generating an analogue signal corresponding to said phase difference;

means for compensating said count value in response to said analogue signal to thereby generate compensated pulse width data having a reduced quantization error; and means for driving said motor in response to said compensated pulse width data.

7. The servo circuit according to claim 6, in which said phase difference detecting and analogue signal generating means includes a first detector for detecting a phase difference between said clock pulse and a rising edge portion of said pulse signal, a second detector for detecting a phase difference between said clock pulse and a trailing edge portion of said pulse signal, and an analogue converting circuit for converting a signal corresponding to a difference between phase differences derived from said first and second detectors to said analogue signal.

8. The servo circuit according to claim 7, in which said converting circuit includes a capacitor and charge and discharge circuits for charging and discharging said capacitor in response to said output signals of said first and second detectors, respectively.

9. The servo circuit according to claim 8, in which said counting means includes a counter, a latch circuit connected to said counter and a digital-to-analogue converter connected to said latch circuit.

10. The servo circuit according to claim 9, in which said compensating means includes an adder circuit for adding said analogue signal to an output signal of said digital-to-analogue converter.

11. The servo circuit according to claim 8, in which said means for compensating includes an analogue-to-digital converter for converting said analogue signal to a corresponding digital signal, a latch circuit for latching said digital signal, and digital adder means for adding the latched digital signal to said count value.

* * * * *